United States Patent
Lin et al.

(10) Patent No.: US 6,662,259 B1
(45) Date of Patent: Dec. 9, 2003

(54) MODULARIZED UNIVERSAL SERIAL BUS HUB

(75) Inventors: Shu-De Lin, Taipei (TW); Chien-Ju Chiang, Taoyuan (TW); Kang-Yao Fan, Hsinchu (TW); Yang-Po Chiu, Keelung (TW)

(73) Assignee: Wistron Corporation and Acer Inc. (TW)

( * ) Notice: Subject to any disclaimer, the term of this patent is extended or adjusted under 35 U.S.C. 154(b) by 441 days.

(21) Appl. No.: 09/699,584

(22) Filed: Oct. 30, 2000

(30) Foreign Application Priority Data

May 19, 2000 (CN) .......................................... 89109809 A

(51) Int. Cl.⁷ ............................................. G06F 13/20
(52) U.S. Cl. ..................... 710/313; 361/732; 439/928
(58) Field of Search ........................ 710/313; 361/728, 361/731, 732, 752, 753, 735, 790, 683; 439/76.1, 74, 502, 928; 713/300, 310

(56) References Cited

U.S. PATENT DOCUMENTS

| | | | |
|---|---|---|---|
| 4,981,438 A | * | 1/1991 | Bekhiet ..................... 439/76.1 |
| 5,645,434 A | * | 7/1997 | Leung ......................... 439/74 |
| 6,462,953 B2 | * | 10/2002 | Tong et al. ................. 361/732 |
| 6,522,550 B1 | * | 2/2003 | Nishio et al. ............... 361/752 |

OTHER PUBLICATIONS

Milan, Stakable Power Supply System, Dec. 19, 2002, Pub. No. US2002/0193015 A1.*

* cited by examiner

Primary Examiner—Khanh Dang
(74) Attorney, Agent, or Firm—Knobbe, Martens, Olson & Bear, LLP

(57) ABSTRACT

The present invention provides a modularized universal serial bus hub. The USB hub includes a power unit, a basic unit, and at least one extension unit. The power unit includes a power terminal for transmitting power signals, and a power port for connecting to a power supplier. The basic unit includes a computer port connected to a computer for transmitting data signals with the computer, a basic unit power terminal connected to the power terminal of the power unit for transmitting the power signals, and a basic unit signal terminal for transmitting the power and data signals. The extension unit includes a first signal terminal connected to the basic unit signal terminal of the basic unit for transmitting the power and data signals with the basic unit, a second signal terminal for transmitting the power and data signals, and at least one device port for a connecting to at least one peripheral device. Each of the mentioned units has a modularized housing and can be mechanically connected to each other.

19 Claims, 11 Drawing Sheets

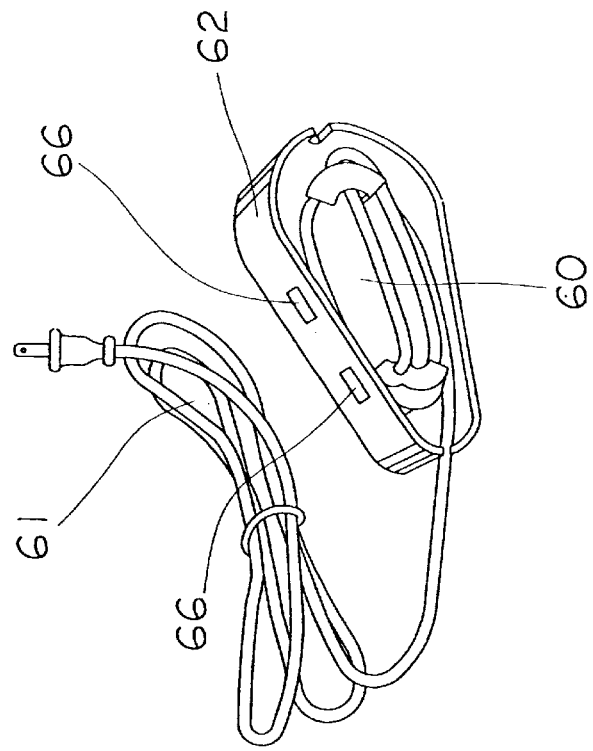
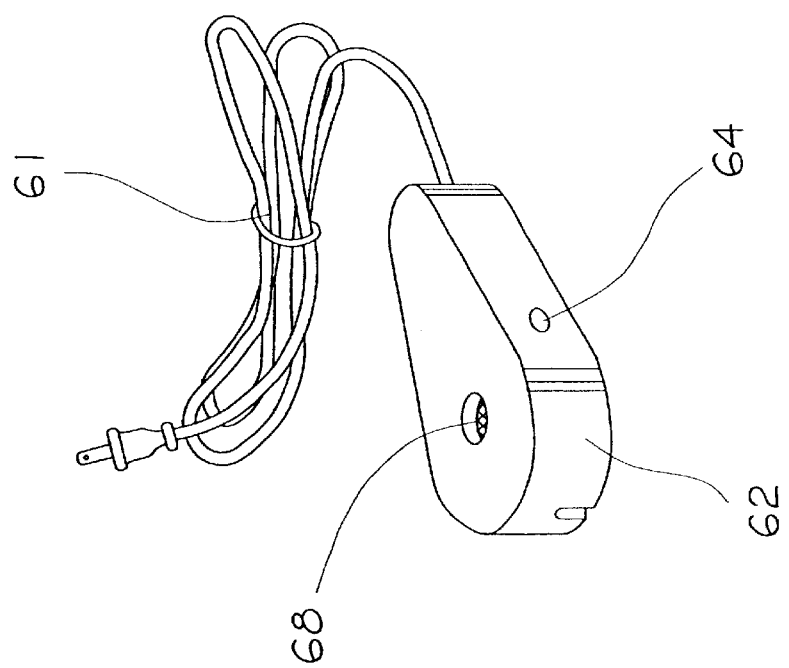

MODULARIZED UNIVERSAL SERIAL BUS HUB

REFERENCE TO RELATED APPLICATION

The present application claims priority to Taiwan application No. 089109809, entitled "A Modularized Universal Serial Bus Hub," filed on May 19, 2000.

BACKGROUND OF THE INVENTION

1. Field of the Invention

The present invention relates to a universal serial bus hub, and more particularly to a modularized universal serial bus hub.

2. Description of the Related Art

A universal serial bus hub is a standard peripheral interface for connecting a computer to different devices, such as digital telephone lines, monitors, modems, mice, printers, scanners, game controllers, keyboards, and so on. The universal serial bus hub can replace RS-232C serial ports, parallel ports, PS/2 interfaces, and game/MIDI ports.

Please refer to FIG. 1. FIG. 1 is a perspective diagram of a prior art universal serial bus hub 10. The universal serial bus hub (USB hub) 10 is used for connecting a computer 13 to several peripheral devices. The USB hub 10 comprises a power port 12 for connecting to a power supply by a power cable 15, a computer port 14 connected to the computer 13 for transmitting data signals with the computer 13, and a plurality of device ports 16 for connecting to a plurality of peripheral devices. In FIG. 1, the USB hub 10 has five device ports 16 for connecting to peripheral devices. The power supply is used for supplying power to the USB hub 10 and some specific peripheral devices connected to the universal serial bus hub 10. When the peripheral device connected to the USB hub 10 is a keyboard, a mouse, and the like, the USB hub 10 supplies power to the peripheral device by the power supply.

Because the number of the device ports of the USB hub 10 is limited, the number of the peripheral device that can be connected to the USB hub 10 is limited. When the device ports are not enough, the user can serially connect another USB hub to the USB hub 10 to increase the number of the device ports to be connected.

Please refer to FIG. 2. FIG. 2 is a perspective diagram of connecting the USB hub 10 to another USB hub 18. The user uses a connection cable 20 to connect the USB hubs 10 and 18. One end of the connection cable 20 is connected to a predetermined device port 16 of the USB hub 10, and the other end of the connection cable 20 is connected to the computer port 22 of the USB hub 18. Therefore, the data signals of the computer 13 can transmit to the USB hub 18. The power port 24 of the USB hub 18 has to be connected to another power supply by another power cable for supplying power to the USB hub 18 and some specific peripheral devices connected to the USB hub 18.

If the total number of the device ports of the USB hubs 10 and 18 is still not enough, the user can serially connect another USB hub to the USB hub 18 to increase the number of the device ports.

In order to increase the number of the device ports, several USB hubs are serially connected to each other. However, when one more USB hub is connected, one more power cable for connecting to another power supply and one more connection cable for serially connecting two USB hubs are required. Therefore, when several USB hubs are serially connected together, several power cables and connection cables are easily tangled together. Furthermore, the serial connection of several USB hubs is space consuming.

SUMMARY OF THE INVENTION

It is therefore a primary objective of the present invention to provide a modularized USB hub to solve the above-mentioned problems.

In a preferred embodiment, the present invention provides a modularized universal serial bus hub. The USB hub comprises a power unit, a basic unit, and at least one extension unit. The power unit comprises a power terminal for transmitting power signals, and a power port for connecting to a power supply. The basic unit comprises a computer port connected to a computer for transmitting data signals with the computer, a basic unit power terminal connected to the power terminal of the power unit for transmitting the power signals, and a basic unit signal terminal for transmitting the power and data signals. The extension unit comprises a first signal terminal connected to the basic unit signal terminal of the basic unit for transmitting the power and data signals with the basic unit, a second signal terminal for transmitting the power and data signals, and at least one device port for connecting to at least one peripheral device. Each of the mentioned units has a modularized housing and can be mechanically connected to each other.

It is an advantage of the present invention that the modularized USB hub according to the present invention is combined by modules so as to increase the number of device port by adding more modules.

These and other objectives of the present invention will no doubt become obvious to those of ordinary skill in the art after having read the following detailed description of the preferred embodiment, which is illustrated in the various figures and drawings.

BRIEF DESCRIPTION OF DRAWINGS

The following detailed description, given by way of examples and not intended to limit the invention to the embodiments described herein, will best be understood in conjunction with the accompanying drawings, in which:

FIG. 12 and FIG. 13 show another power unit and basic unit of the USB hub in FIG. 3;

DETAILED DESCRIPTION OF THE INVENTION

Figure 1:
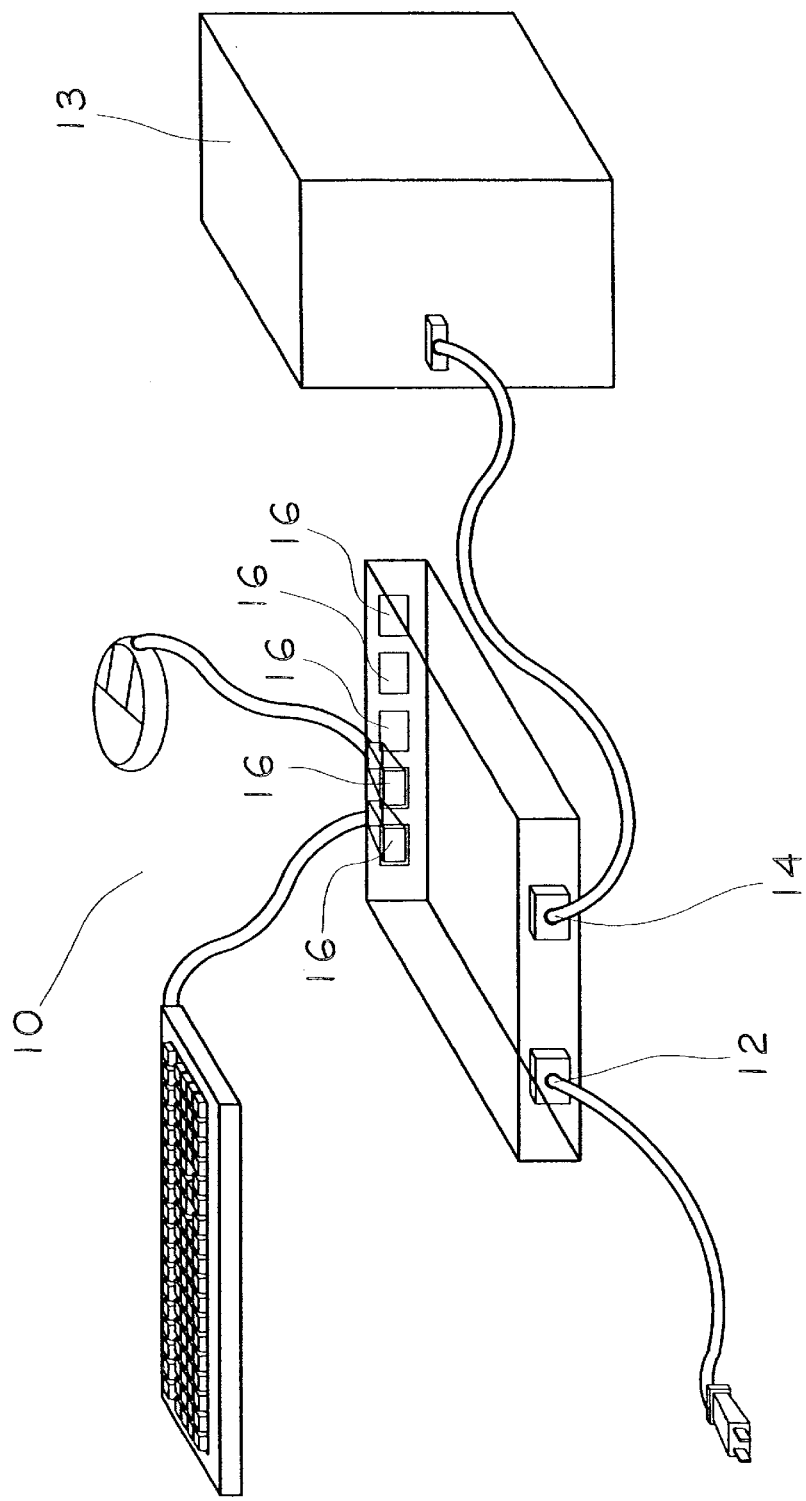
FIG. 1 is a perspective diagram of a prior art universal serial bus hub (USB hub)
Figure 2:
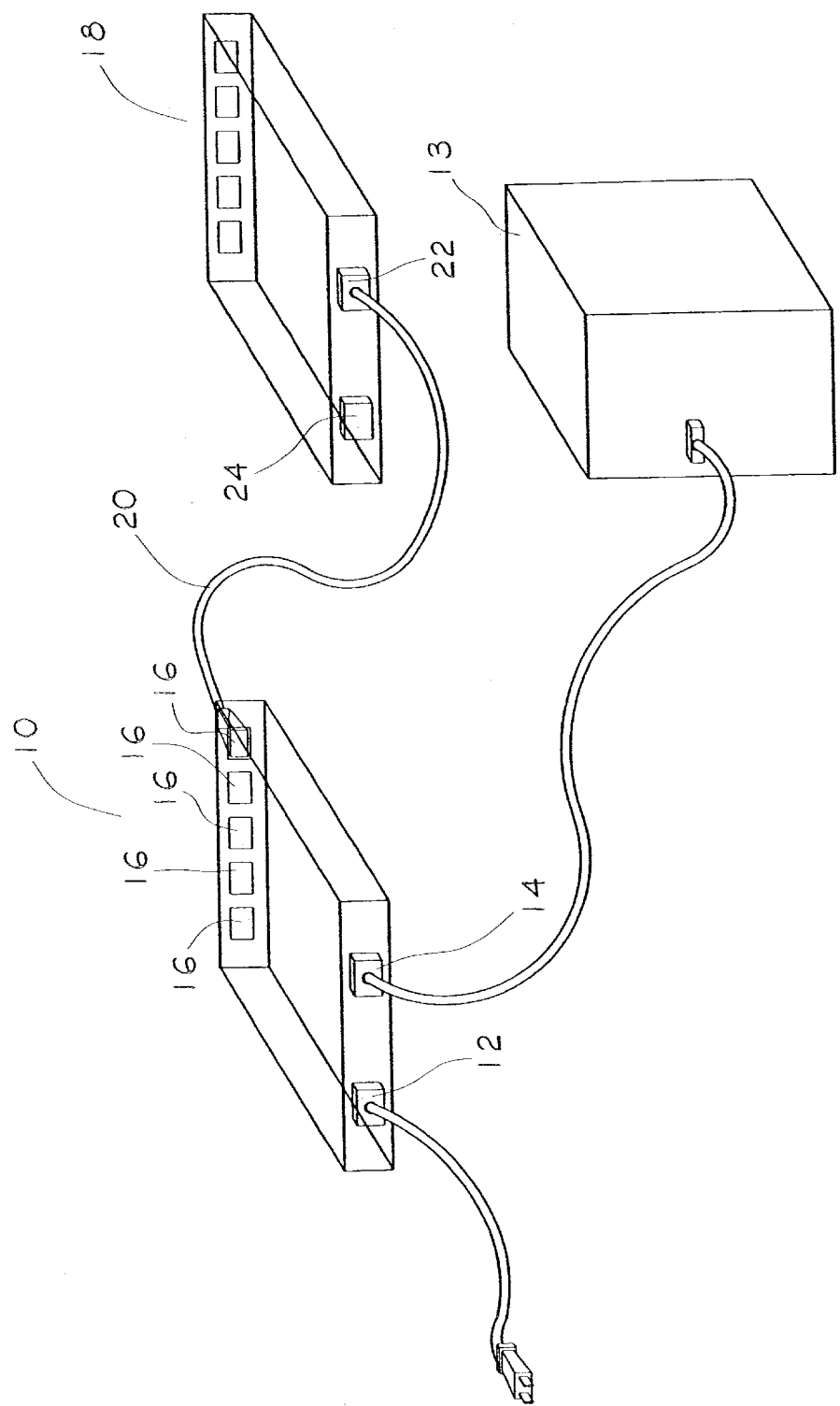
FIG. 2 is a perspective diagram of connecting the USB hub to another USB hub.
Figure 3:
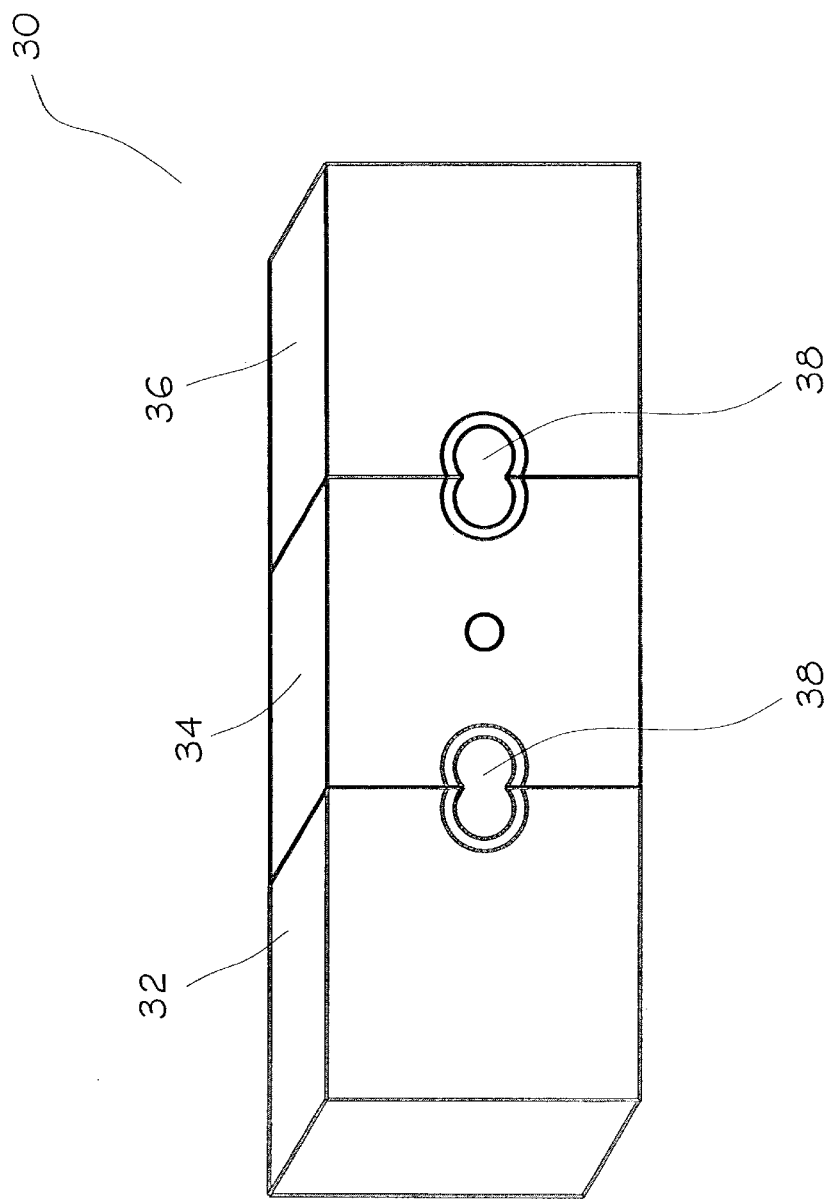
FIG. 3 is a perspective diagram of a universal serial bus hub (USB hub) according to the present invention.
Figure 4:
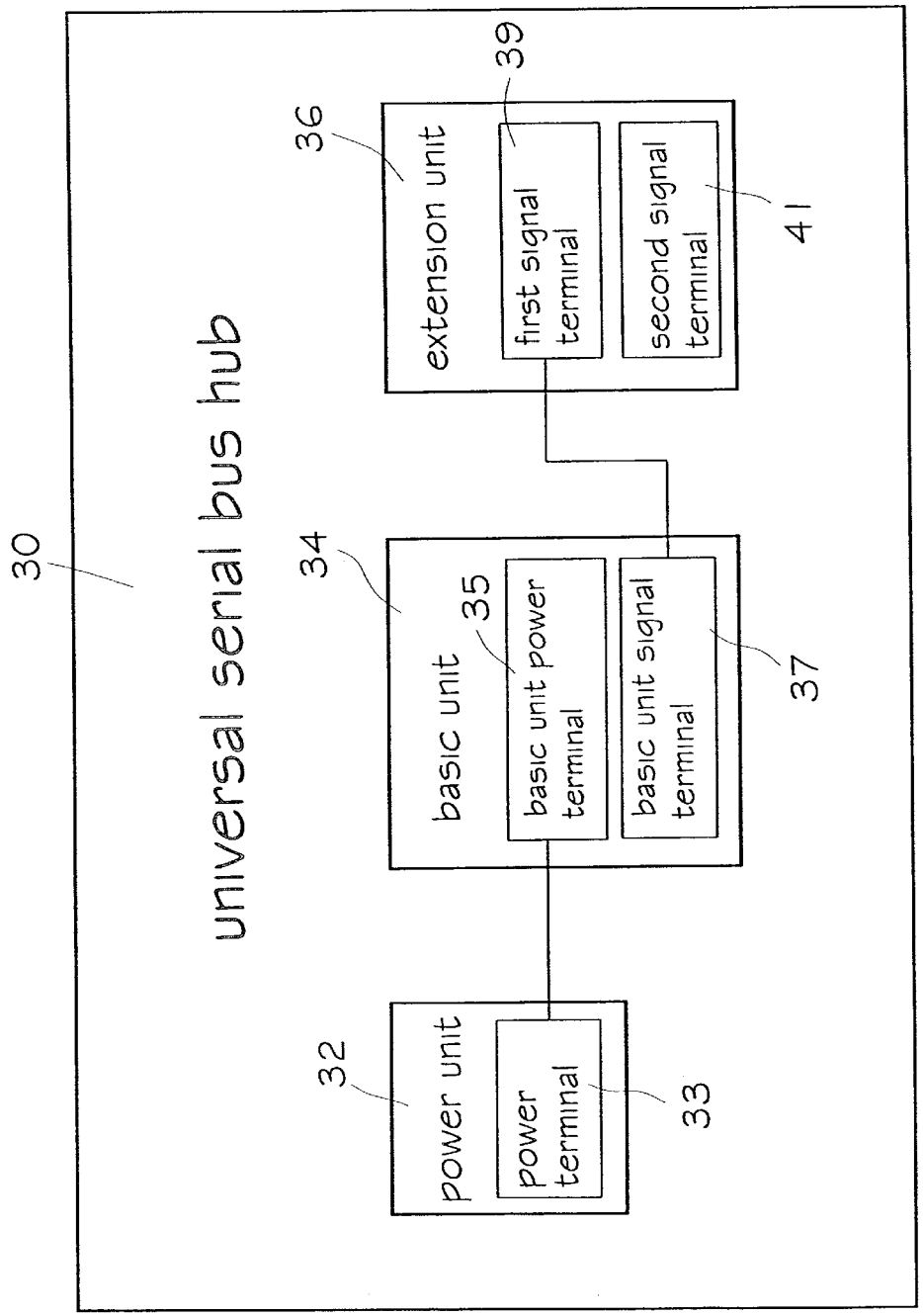
FIG. 4 is a functional block diagram of the USB hub in FIG. 3.

Please refer to FIG. 3 and FIG. 4. FIG. 3 is a perspective diagram of a universal serial bus hub (USB hub) 30 according to the present invention. FIG. 4 is a functional block diagram of the USB hub 30 in FIG. 3. The USB hub 30 comprises a power unit 32, basic unit 34, extension unit 36, and two signal connection units 38. The power unit 32 comprises a power terminal 33 for transmitting power signals. The basic unit 34 comprises a basic unit power terminal 35 connected to the power terminal 33 of the power unit 32 for transmitting the power signals, and a basic unit signal terminal 37 for transmitting the power and data signals. The extension unit 36 comprises a first signal terminal 39 connected to the basic unit signal terminal 37 of the basic unit 34 for transmitting the power and data signals with the basic unit 34, and a second signal terminal 41 for transmitting the power and data signals.

Figure 6:
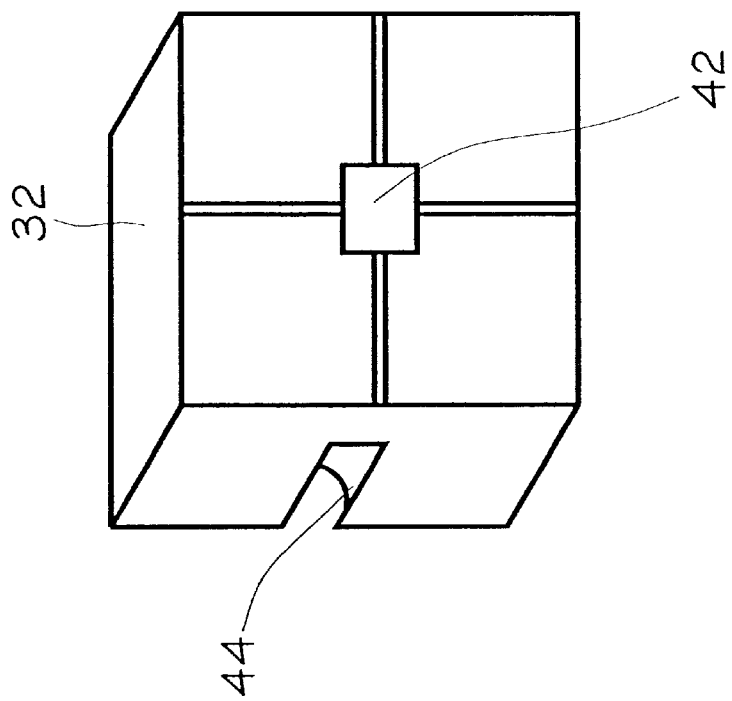
FIG. 6 is a back view of the power unit of the USB hub in FIG. 3.
Figure 5:
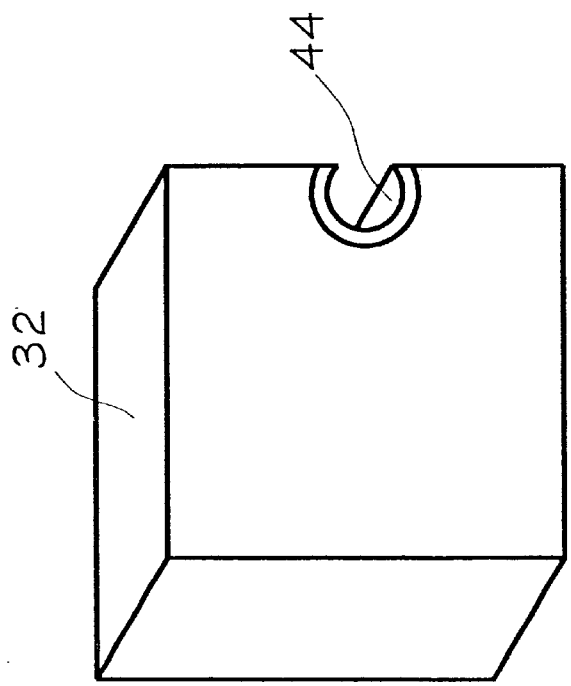
FIG. 5 is a front view of the power unit of the USB hub in FIG. 3.

Please refer to FIG. 5 and FIG. 6. FIG. 5 is a front view of the power unit 32 of the USB hub 30 in FIG. 3. FIG. 6 is a back view of the power unit 32 of the USB hub 30 in FIG. 3. The power unit 32 comprises a power port 42 for connecting to a power supply (not shown), and a slot 44 installed at one side of its housing. The power terminal 33 is installed in the slot 44.

Figure 8:
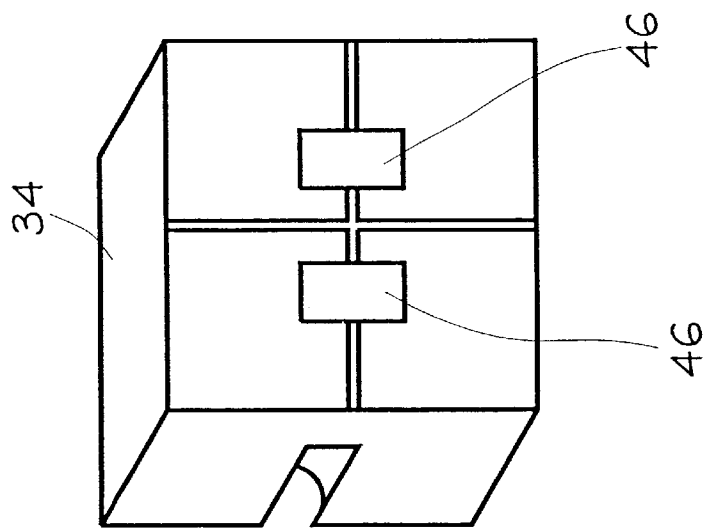
FIG. 8 is a back view of the basic unit of the USB hub in FIG. 3.
Figure 7:
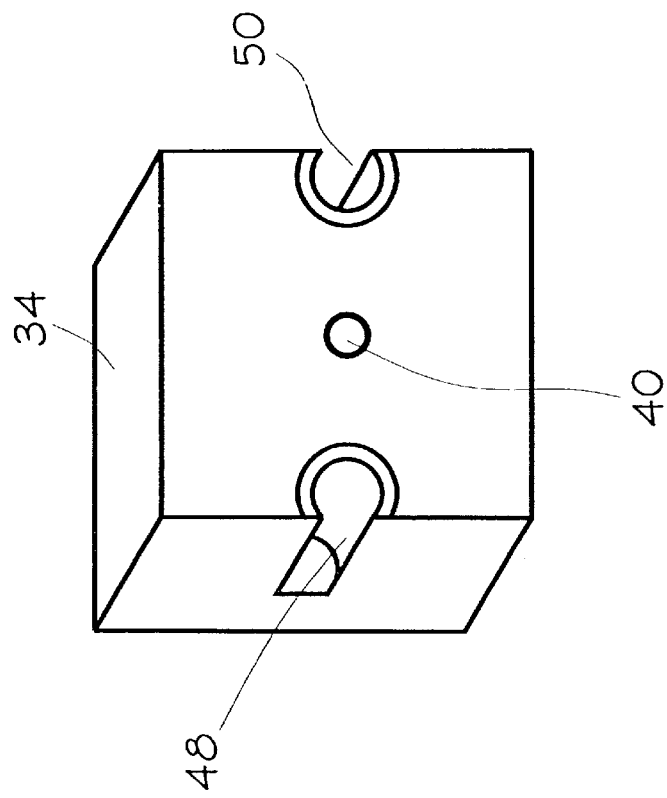
FIG. 7 is a front view of the basic unit of the USB hub in FIG. 3.

Please refer to FIG. 7 and FIG. 8. FIG. 7 is a front view of the basic unit 34 of the USB hub 30 in FIG. 3. FIG. 8 is a back view of the basic unit 34 of the USB hub 30 in FIG. 3. The basic unit 34 comprises a computer port 40 connected to a computer (not shown) for transmitting data signals with the computer, two device ports 46 for connecting to peripheral devices (not shown), a first slot 48 installed at a first side of its housing, and a second slot 50 installed at a second side of its housing. The basic unit power terminal 35 is installed in the first slot 48, and the basic unit signal terminal 37 is installed in the second slot 50.

Figures 9, 10, 11:
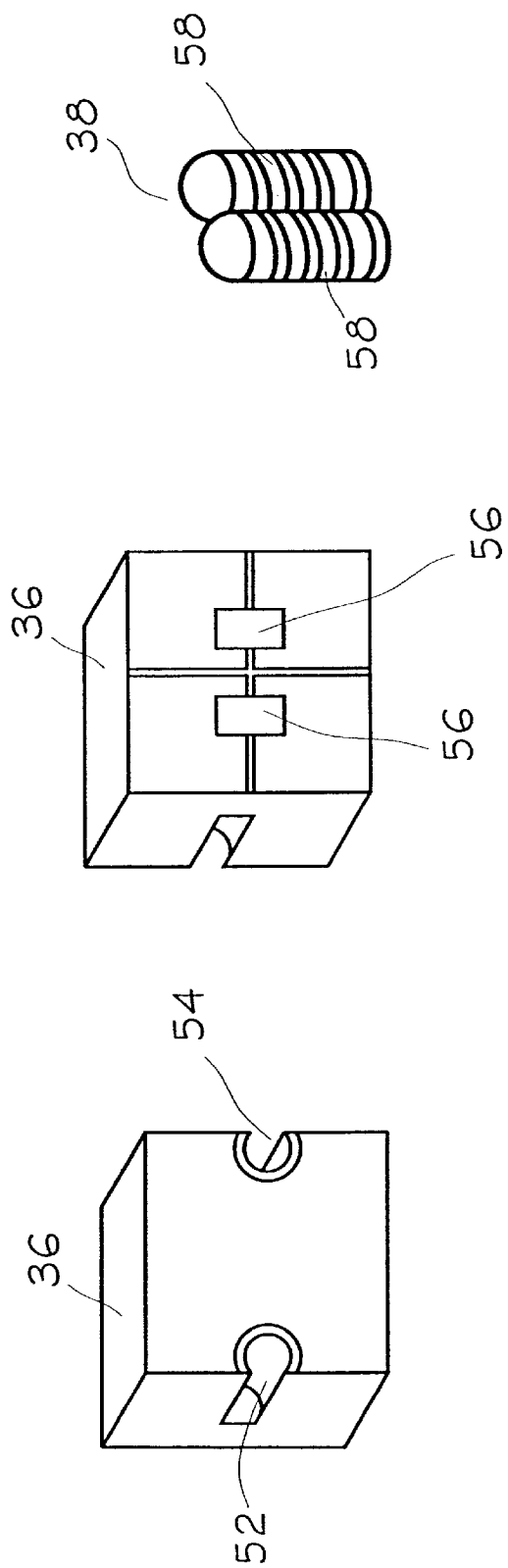
FIG. 9 is a front view of the extension unit of the USB hub in FIG. 3.
FIG. 10 is a back view of the extension unit of the USB hub in FIG. 3.
FIG. 11 is a perspective diagram of the signal connection unit of the USB hub in FIG. 3.

Please refer to FIG. 9 and FIG. 10. FIG. 9 is a front view of the extension unit 36 of the USB hub 30 in FIG. 3. FIG. 10 is a back view of the extension unit 36 of the USB hub 30 in FIG. 3. The extension unit 36 comprises a first slot 52 installed at a second side of its housing, a second slot 54 installed in a second side of its housing, and two device ports 56 for connecting to peripheral devices (not shown). The first signal terminal 39 of the extension unit 36 is installed in the first slot 52, and the second signal terminal 41 of the extension unit 36 is installed in the second slot 54.

Please refer to FIG. 11. FIG. 11 is a perspective diagram of the signal connection unit 38 of the USB hub 30 in FIG. 3. The signal connection unit 38 comprises two protruding portions 58 for transmitting the power and data signals.

As shown in FIG. 3, when one protruding portion 58 of the signal connection unit 38 is placed into the slot 44 of the power unit 32 and another protruding portion 58 of the signal connection unit 38 is placed into the first slot 48 of the basic unit 34, the basic unit 34 is mounted on the power unit 32 and the power terminal 33 of the power unit 32 is connected to the basic unit power terminal 35 of the basic unit 34 so as to transmit power signals between the power unit 32 and the basic unit 34. When one protruding portion 58 of the signal connection unit 38 is placed into the second slot 50 of the basic unit 34 and another protruding portion 58 of the signal connection unit 38 is placed into the first slot 52 of the extension unit 36, the extension unit 36 is mounted on the basic unit 34 and the basic unit signal terminal 37 of the basic unit 34 is connected to the first signal terminal 39 of the extension unit 36 so as to transmit power and data signals between the basic unit 34 and the extension unit 36.

In FIG. 3, if the number of the device ports 46 of the basic unit 34 is enough, the user can only use the power unit 32 and the basic unit 34, and no extension unit 36 is required. Conversely, if the number of the device ports 46 of the basic unit 34 is not enough, the user can connect the basic unit 34 to a extension unit 36 to increase the number of device ports. The user can increase the number of the extension unit 36 according to the required number of device ports.

When the user connects two extension units 36, the user places one protruding portion 58 of the signal connection unit 38 into the second slot 54 of the extension unit 36 and places another protruding portion 58 of the signal connection unit 38 into a first slot 52 of another extension unit 36, the two extension units 36 are connected to each other and the second signal terminal 41 of the extension unit 36 is connected to a first signal terminal 39 of another extension unit 36 so as to transmit power and data signals between the two extension units 36.

Please refer to FIG. 12 and FIG. 13. FIG. 12 and FIG. 13 show another power unit 60 and basic unit 62 of the USB hub 30 in FIG. 3. The power unit 60 is mounted in the basic unit 62. The power terminal 33 of the power unit 60 is directly connected to the basic unit power terminal 35 of the basic unit 62 so as to transmit power signals between the power unit 60 and the basic unit 62. The power unit 60 is used for connecting to a power supply (not shown) by a power cable 61. The basic unit 62 comprises a computer port 64 connected to a computer (not shown) for transmitting data signals with the computer, two device ports 66 for connecting to peripheral devices (not shown), and a slot 68. The basic unit power terminal 37 is installed in the slot 68.

Figure 15:
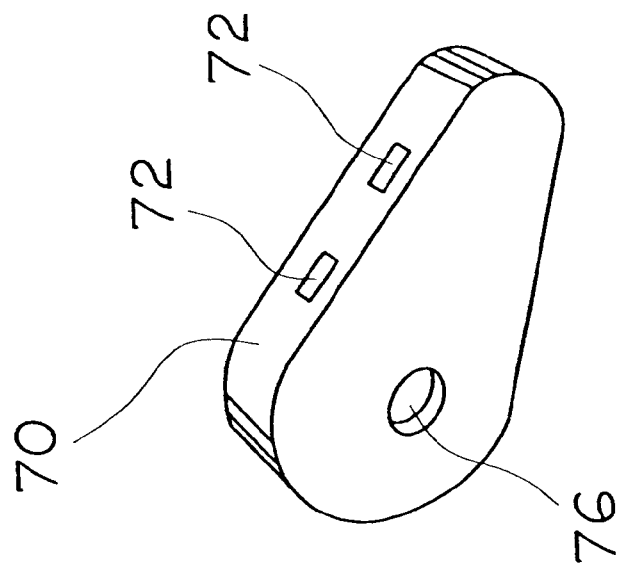
FIG. 14 and FIG. 15 show another extension unit of the USB hub in FIG. 3.
Figure 14:
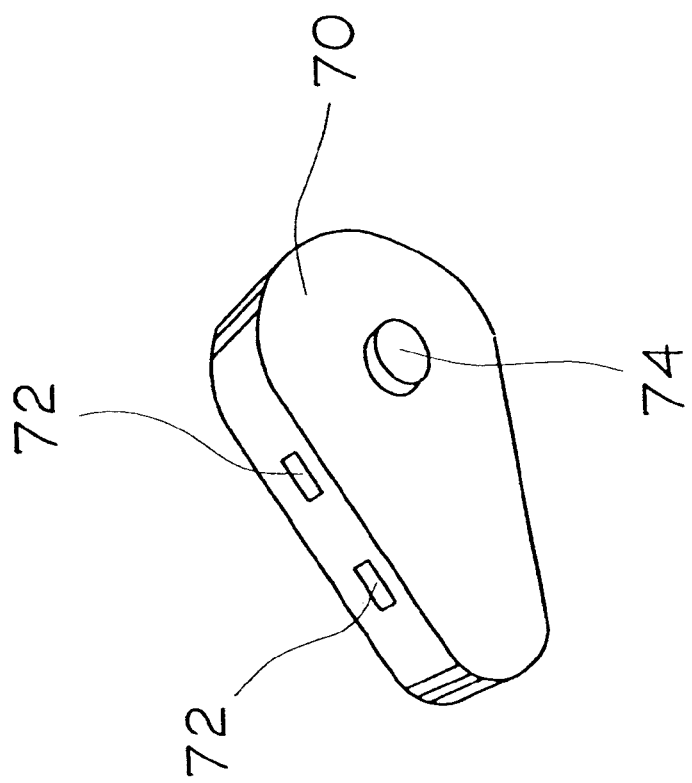

Please refer to FIG. 14 and FIG. 15. FIG. 14 and FIG. 15 show another extension unit 70 of the USB hub 30 in FIG. 3. The extension unit 70 comprises two device ports 72 for connecting to peripheral device (not shown), a protruding portion 74 installed at a first side of its housing, and a slot 76 installed in a second side of its housing. The first signal terminal 39 of the extension unit 70 is installed in the protruding portion 74, and the second signal terminal 41 of the extension unit 70 is installed in the slot 76.

Figure 16:
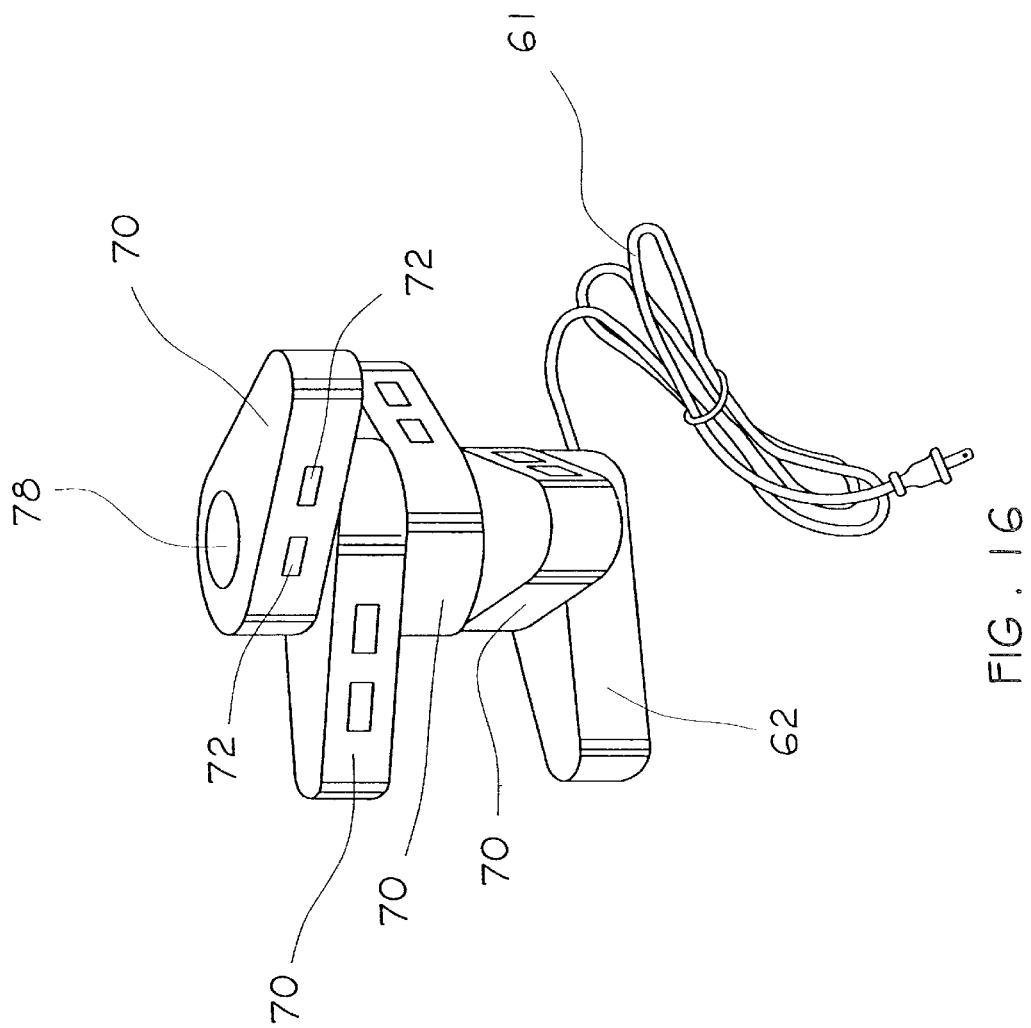
FIG. 16 is a perspective diagram of combining the basic unit and several extension units.

Please refer to FIG. 16. FIG. 16 is a perspective diagram of combining the basic unit 62 and several extension units 70. When the protruding portion 74 of the extension unit 70 is placed into the slot 68 of the basic unit 62, the extension unit 70 is rotatably mounted on the basic unit 62. The basic unit signal terminal 37 of the basic unit 62 is connected to the first signal terminal 39 of the extension unit 70 so as to transmit power and data signals between the basic unit 62 and the extension unit 70. When a protruding portion 74 of another extension unit 70 is placed into the slot 76 of the extension unit 70, the two extension units 70 are rotatably connected to each other. A first signal terminal 39 of another extension unit 70 is connected to the second signal terminal 41 of the extension unit 70 so as to transmit the power and data signals between the two extension units 70. As shown in FIG. 16, the USB hub further comprises a cover 78 placed over the slot 76 of the upper extension unit 70.

If the number of the device ports of the basic unit 62 is enough, no extension unit 70 is required, and the cover 78 is placed over the slot 68 of the basic unit 62.

Figure 17:
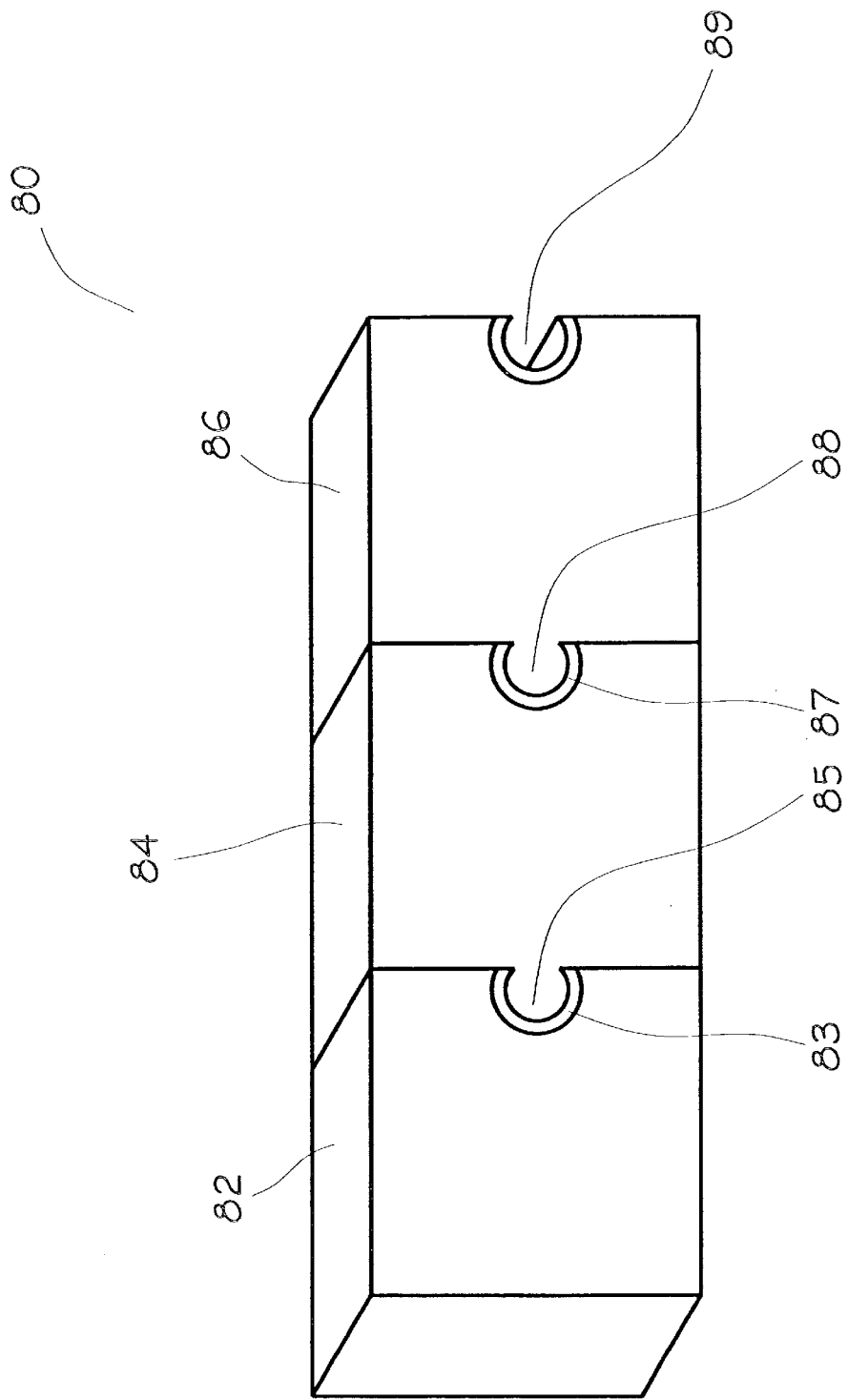
FIG. 17 is another USB hub according to the invention.

Please refer to FIG. 17. FIG. 17 is another USB hub 80 according to the invention. The difference between the USB hub 80 in FIG. 17 and the USB hub 30 in FIG. 3 is the method of connecting the power unit 82, the basic unit 84 and the extension unit 86. The power unit 82 comprises a slot 83 and the power terminal 33 is installed in the slot 83. The basic unit 84 comprises a protruding portion 85 installed at a first side of its housing, and a slot 87 installed at a second side of its housing. The basic unit power terminal 35 is installed in the protruding portion 85, and the basic unit signal terminal 37 is installed in the slot 87. The extension unit 86 comprises a protruding portion 88 installed at a first side of its housing, and a slot 89 installed in a second side of its housing. The first signal terminal 39 of the extension unit 86 is installed in the protruding portion 88, and the second signal terminal 41 of the extension unit 86 is installed in the slot 89.

Compared with the prior art USB hub, the user can increase the number of the device ports of the USB hub according to the invention by increasing the number of the extension units. Because the installing of the extension unit is simple, the user can mount one extension unit on the basic unit or another extension unit without using a connection cable and without adding a power cable. Therefore, the flexibility and convenience of using the USB hub according to the invention is promoted.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A universal serial bus hub system comprising:
    a modularized power unit comprising:
       a power unit housing;
       a power terminal for transmitting power signals; and
       a power port installed in said power unit housing connectable to a power supply;
    a modularized basic unit mechanically and electrically connectable to the power unit, the modularized basic unit comprising:
       a basic unit housing;
       a computer port connectable to a computer for exchanging data signals with the computer;
       a basic unit power terminal connectable to the power terminal of the power unit for receiving the power signals;
       a basic unit signal terminal for communicating the power signals and the data signals; and
       at least one device port connectable to at least one peripheral device;
    a modularized extension unit mechanically and electrically connectable to the extension unit, the modularized extension unit comprising:
       an extension unit housing;
       a first signal terminal connectable to the basic unit signal terminal of the basic unit for receiving the power signal from the basic unit and for exchanging the data signals with the basic unit;
       a second signal terminal for transmitting the power signal and for exchanging the data signals; and
       at least one device port connectable to at least one peripheral device;
    wherein each of the mentioned units can be modularized and can be mechanically connected to each other;
    a first signal connection unit connectable between the power unit and the basic unit to transmit the power signal from the power unit to the basic unit; and
    a second signal connection unit connectable between the basic unit and the extension unit to transmit the power signal from the basic unit to the extension unit and to couple the data signals between the basic unit and the extension unit.

2. The universal serial bus hub system of claim 1, wherein the basic unit further comprises at least one device port connectable to at least one peripheral device.

3. The universal serial bus hub system of claim 1, wherein the power unit further comprises a power port connectable to a power supply.

4. The universal serial bus hub system of claim 1, wherein the first signal connection unit comprises a protruding portion of the basic unit and wherein the power terminal of the power unit is electrically connected to the power terminal of the basic unit when the protruding portion of the basic unit is engaged in a slot of the power unit to enable power transmission from the power unit to the basic unit.

5. The universal serial bus hub system of claim 1, wherein the basic unit is rotatably mounted on the power unit.

6. The universal serial bus hub system of claim 1, wherein:
    the basic unit comprises a protruding portion located at a side of the basic unit housing; and
    the basic unit power terminal is located in the protruding portion.

7. The universal serial bus hub system of claim 1, wherein:
    the basic unit further comprises a slot located in a side of the basic unit housing; and
    the basic unit signal terminal is located in the slot.

8. The universal serial bus hub system of claim 1, wherein:
    the extension unit comprises a protruding portion located in a first side of the extension unit housing;
    the first signal terminal of the extension unit is located in the protruding portion;
    the extension unit further comprises a slot installed in a second side of the extension unit housing;
    the second signal terminal of the extension unit is installed in the slot; and
    when the protruding portion of the extension unit is engaged with the slot of the basic unit, the signal terminal of the basic unit is coupled to the first signal terminal to enable power to be transmitted to the extension unit and to enable data signals to be exchanged between the basic unit and the extension unit.

9. The universal serial bus hub system of claim 8 wherein the extension unit is rotatably mounted on the basic unit.

10. The universal serial bus hub system of claim 8 wherein:
    the extension unit is a first extension unit;
    the system further comprises a second extension unit, the second extension unit comprising:
       a protruding portion engageable with the slot in the second side of the extension unit housing of the first extension unit;

a signal terminal located in the protruding portion to enable the power signals to be transmitted to the second extension unit and to enable data signals to be exchanged between the first extension unit and the second extension unit when the protruding portion of the second extension unit is engaged with the slot of the first extension unit.

11. The universal serial bus hub system of claim 10 wherein the first extension unit and the second extension unit are rotatably connectable to each other.

12. The universal serial bus hub system of claim 1 wherein:

the power unit comprises a slot installed at one side of the power unit housing;

the power terminal is installed in the slot in the power unit housing;

the basic unit comprises a first slot installed at a first side of the basic unit housing;

the basic unit power terminal is installed in the first slot of the basic unit housing; and the first signal connection unit comprises a first protruding portion engageable with the slot in the side of the power unit housing and a second protruding portion engageable with the first slot of the basic unit housing, the signal connection unit the transmitting power signals from the power unit to the basic unit when the first protruding portion of the signal connection unit is engaged with the slot in the side of the power unit housing and the second protruding portion of the signal connection unit is engaged with the first slot of the basic unit housing.

13. The universal serial bus hub system of claim 1 wherein:

the basic unit further comprises a slot installed at a side of the basic unit housing;

the basic unit signal terminal is installed in the slot at the side of the basic unit housing;

the extension unit comprises a first slot installed at a first side of the extension unit housing;

the first signal terminal of the extension unit is installed in the first slot of the extension unit;

the extension unit further comprises a second slot installed at a second side of the extension unit housing;

the second signal terminal of the extension unit is installed in the second slot of the extension unit; and the second signal connection unit comprises a first protruding portion engageable with the slot in the side of the basic unit housing and a second protruding portion engageable with the first slot of the extension unit housing, the second signal connection unit transmitting power signals from the basic unit to the extension unit and communicating the data signals between the basic unit and the extension unit when the first protruding portion of the second signal connection unit is engaged with the slot in the side of the basic unit housing and the second protruding portion of the second signal connection unit is engaged with the first slot of the extension unit housing.

14. The universal serial bus hub system of claim 1 wherein:

the extension unit is a first extension unit;

the system further comprises:

a second extension unit, the second extension unit comprising a second extension unit housing and a first slot at a first side of the second extension unit housing;

a third connection unit having first protruding portion engageable with the second slot of the first extension unit and second protruding portion engageable with the first slot of the second extension unit, the third signal connection unit transmitting power signals from the first extension unit to the second extension unit and communicating the data signals between the first extension unit and the second extension unit when the first protruding portion of the third signal connection unit is engaged with the second slot in the first extension unit housing and the second protruding portion of the third signal connection unit is engaged with the first slot of the second extension unit housing.

15. The universal serial bus hub system of claim 1 wherein:

the first signal connection unit comprises two protruding portions for transmitting the power signal from the power unit to the basic unit; and the second signal connection unit comprises two protruding portions for transmitting the power signal from the basic unit to the extension unit and for exchanging the data signals between the basic unit and the extension unit.

16. The universal serial bus hub system of claim 15, wherein the two protruding portions of the first signal connection unit include electrically conductive material to transmit the power signal when the two protruding portions are engaged with the power unit and the basic unit.

17. The universal serial bus hub system of claim 16, wherein:

the power terminal of the power unit comprises an electrically conductive material engageable with the electrically conductive material of one of the two protruding portions of the first signal connection unit; and the power terminal of the basic unit comprises an electrically conductive material engageable with the electrically conductive material of the other of the two protruding portions of the first signal connection unit.

18. The universal serial bus hub system of claim 15, wherein the two protruding portions of the second signal connection unit include electrically conductive material to transmit the power signal and to communicate the data signals when the two protruding portions are engaged with the basic unit and the extension unit.

19. The universal serial bus hub system of claim 18, wherein:

the signal terminal of the basic unit comprises an electrically conductive material engageable with the electrically conductive material of one of the two protruding portions of the second signal connection unit; and the first signal terminal of the extension unit comprises an electrically conductive material engageable with the electrically conductive material of the other of the two protruding portions of the second signal connection unit.

\* \* \* \* \*